(12) United States Patent
Rowe

(10) Patent No.: US 9,125,294 B2
(45) Date of Patent: Sep. 1, 2015

(54) SHIELD

(75) Inventor: Adrian Thomas Rowe, Newport (GB)

(73) Assignee: BAE SYSTEMS PLC, London (GB)

( * ) Notice: Subject to any disclaimer, the term of this patent is extended or adjusted under 35 U.S.C. 154(b) by 769 days.

(21) Appl. No.: 13/139,414

(22) PCT Filed: Dec. 8, 2009

(86) PCT No.: PCT/GB2009/051663
§ 371 (c)(1),
(2), (4) Date: Jun. 13, 2011

(87) PCT Pub. No.: WO2010/067106
PCT Pub. Date: Jun. 17, 2010

(65) Prior Publication Data
US 2011/0241932 A1 Oct. 6, 2011

(30) Foreign Application Priority Data

Dec. 12, 2008 (EP) .................................... 08253999
Dec. 12, 2008 (GB) .................................. 0822652.4

(51) Int. Cl.
*G01S 13/00* (2006.01)
*H05K 9/00* (2006.01)
*H05K 7/20* (2006.01)
(52) U.S. Cl.
CPC ............ *H05K 9/006* (2013.01); *H05K 7/20563* (2013.01); *H05K 9/0062* (2013.01)
(58) Field of Classification Search
CPC .... G01S 7/032; H05K 9/0071; H05K 9/0073; H05K 9/003; H05K 9/006; H05K 9/0062; H05K 8/20563

USPC .......................................................... 342/175
See application file for complete search history.

(56) References Cited

U.S. PATENT DOCUMENTS 3,702,478 A * 11/1972 Georgian ...................... 343/702
4,414,550 A * 11/1983 Tresselt ................. 343/700 MS
5,151,769 A * 9/1992 Immorlica et al. ............ 257/659
5,442,521 A * 8/1995 Hirvonen et al. ............. 361/800

(Continued)

FOREIGN PATENT DOCUMENTS

CA          2 537 401        8/2007
JP         2001-148586       5/2001

(Continued)

OTHER PUBLICATIONS

International Preliminary Report on Patentability together with the Written Opinion from PCT/GB2009/051663 dated Jun. 23, 2011.

(Continued)

*Primary Examiner* — Frank J McGue
(74) *Attorney, Agent, or Firm* — Scully, Scott, Murphy & Presser P.C.

(57) ABSTRACT

A printed circuit board shield (100) is provided. The shield comprises a sealing surface (120) and a shielding surface (110). The sealing surface is configured to cooperate with, and be connectable to, a sealing region of a printed circuit board (80) upon assembly therewith. The shielding surface is substantially parallel to but offset from, the sealing surface. A concave cover for receiving at least part of the printed circuit board is thereby defined. The shielding surface comprises an array of perforations (130) formed therethrough. The array of perforations is configured to correspond to a location of an electronic component mounted on the printed circuit board.

19 Claims, 4 Drawing Sheets

(56) References Cited

U.S. PATENT DOCUMENTS

Figure 1:
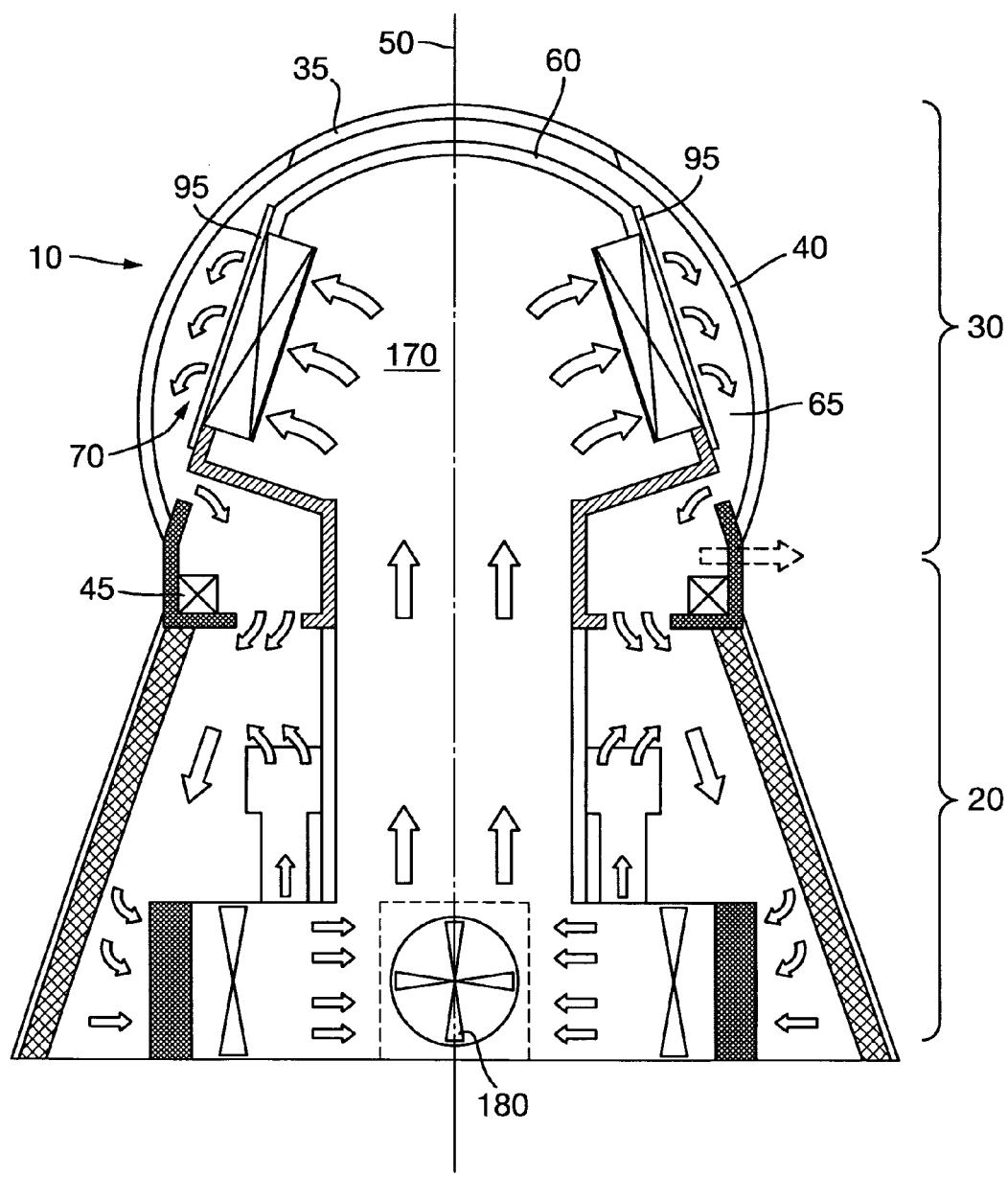

| | | | | |
|---|---|---|---|---|
| 6,178,097 | B1* | 1/2001 | Hauk, Jr. | 361/816 |
| 7,106,050 | B1* | 9/2006 | Scranton | 324/750.27 |
| 7,371,977 | B1* | 5/2008 | Preonas | 174/383 |
| 2003/0156398 | A1* | 8/2003 | Haden et al. | 361/780 |
| 2004/0155723 | A1* | 8/2004 | Koriyama | 333/26 |
| 2004/0216909 | A1 | 11/2004 | Lloyd et al. | |
| 2005/0179512 | A1* | 8/2005 | Weyers et al. | 335/300 |
| 2008/0049409 | A1 | 2/2008 | Chen et al. | |
| 2008/0137291 | A1 | 6/2008 | Mongia et al. | |
| 2010/0000197 | A1* | 1/2010 | Snyder et al. | 60/39.5 |

FOREIGN PATENT DOCUMENTS

| | | |
|---|---|---|
| WO | WO 01/54466 A1 | 7/2001 |
| WO | WO 01/99483 A1 | 12/2001 |

OTHER PUBLICATIONS

International Search Report dated Mar. 11, 2010 issued in PCT/GB2009/051663.
Extended European Search Report dated May 20, 2009 issued in EP 08 25 3999.0.
UK Search Report dated Mar. 20, 2009 issued in GB0822652.4.

* cited by examiner

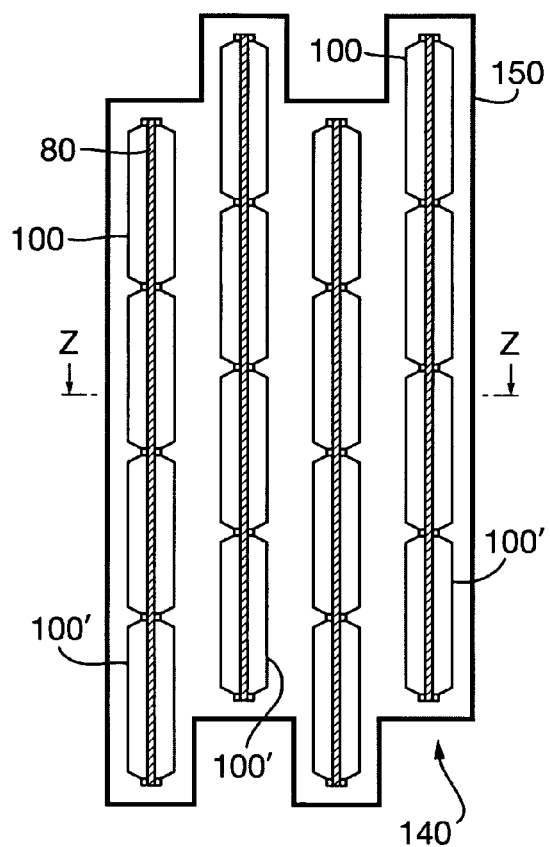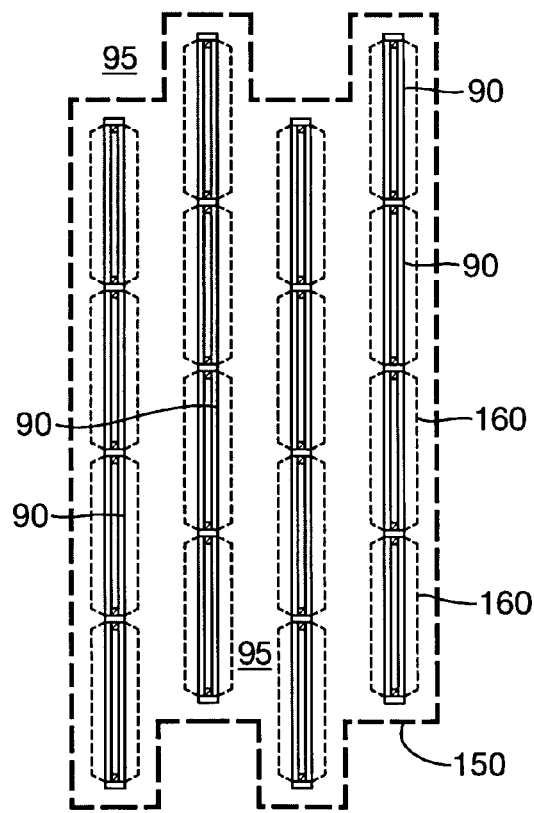

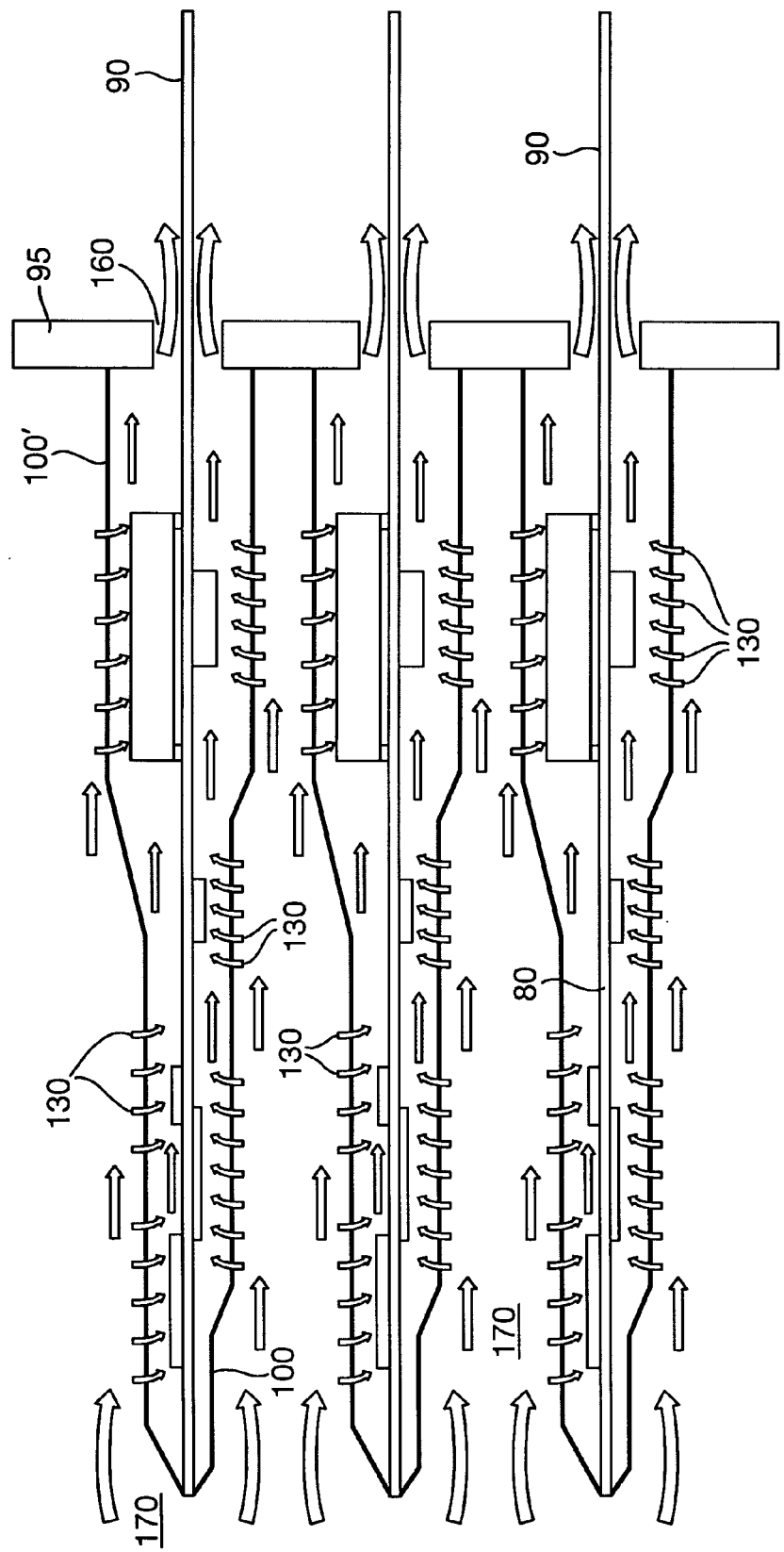

SHIELD

The present invention relates to the field of shielding devices, in particular to a shield for protecting electrical components of a radar installation.

Transmit/receive units (TRU) of a phased radar installation use high power amplifiers together with other heat generating electrical components. Consequently, the temperature of the TRU increases in operation which can be detrimental to the performance and service life thereof. Cooling of the TRU is, therefore, critical. It is also desirable to minimise power consumption of the phased radar installation such that heat generated thereby is correspondingly reduced.

In conventional systems the units are flushed with cooling air in order to reduce the temperature of the operating environment of the electrical components such that good heat transfer therefrom can be achieved. However, significant air flow is required in order to effect a desired level of cooling. Generation of this air flow requires a significant amount of power and further contributes to heat generation.

It is desirable to enhance cooling of the electrical components involved whilst minimising any increased generation of heat.

According to a first aspect, the present invention provides a printed circuit board shield comprising:
   a sealing surface configured to cooperate with and be connectable to a sealing region of a printed circuit board upon assembly therewith; and
   a shielding surface, substantially parallel to but offset from the sealing surface to thereby define a cover for receiving at least part of the printed circuit board, the shielding surface comprising an array of perforations formed therethrough, the array of perforations being configured to correspond to a location of an electronic component mounted on the printed circuit board.

Introduction of a shield provides improved mechanical/physical protection of electronic components located on the printed circuit board (PCB). However, such a shield would be expected to inhibit air flow around the components and, therefore inhibit cooling thereof. By providing a perforated shield that is, consequently, particularly configured to achieve cooling of the electronic components, a multi purpose functionality, including shielding and cooling, can be achieved.

Furthermore, by providing the shield in combination with the printed circuit board, the stiffness, and therefore, support of the PCB is enhanced upon installation of the shield. In particular, the shield provides protection during handling of the PCB whilst remaining light weight and, therefore, minimises the structural loading burden on a framework of the radar installation.

The offset between the shielding surface and the sealing surface may be selected in dependence on a height of the electronic component. A second shielding surface, having a second offset, may be provided. The second offset may be selected in dependence on a height of a second electronic component mounted on the printed circuit board.

The number, spacing, distribution and/or magnitude of perforations in the array may each be configured in dependence on a heat generating capacity of the, or each, electronic component.

By customising the distance of the shielding surface from particular components to be cooled, the characteristics of an impingement jet, formed in operation of the device, can be carefully controlled. This control is further enhanced by the selection of the number of perforations, the pattern of the perforations, the diameter of the perforations and/or the density of the perforations such that an optimum level of heat dissipation is achieved.

In addition to providing physical/mechanical protection, the shield may be configured to serve as a radio frequency interference screen and/or the shield may be configured to serve as an electromagnetic interference screen.

The shield may comprise a metallic material such as aluminium and/or a metallised material such as a composite, a ceramic material or a plastics material with a metallised coating. The shield may be manufactured by super-plastic forming. Consequently, a very lightweight device is achieved.

According to a second aspect, the present invention provides a transmit/receive unit (TRU) for a radar installation comprising:
   a printed circuit board (PCB) comprising an antenna element having a dipole associated therewith; and
   a shield of the aforementioned type, the shield being sealably connected to the PCB, such that the TRU comprises an inlet defined by the array of perforations configured to permit ingress of cooling fluid and an outlet configured to permit egress of cooling fluid.

The printed circuit board may comprise a plurality of antenna elements and each element may have a dipole associated therewith. The TRU may comprise a plurality of inlets, each inlet may be associated with a respective antenna element. The TRU may comprise a plurality of outlets, each outlet may be associated with a respective antenna element.

According to a third aspect the present invention provides a radar installation comprising:
   an antenna housing;
   an array face plate, mounted within the antenna housing, the plate comprising a plurality of apertures therethrough;
   a first plenum configured to receive cooling fluid;
   a transmit/receive unit of the aforementioned type, mounted on and sealably connected to a surface of the array face plate, the, or each, dipole of the TRU protruding through a respective aperture, the, or each, inlet of the TRU being in fluid communication with the first plenum and the, or each, outlet of the TRU being co-located with a respective aperture.

Figure 2:
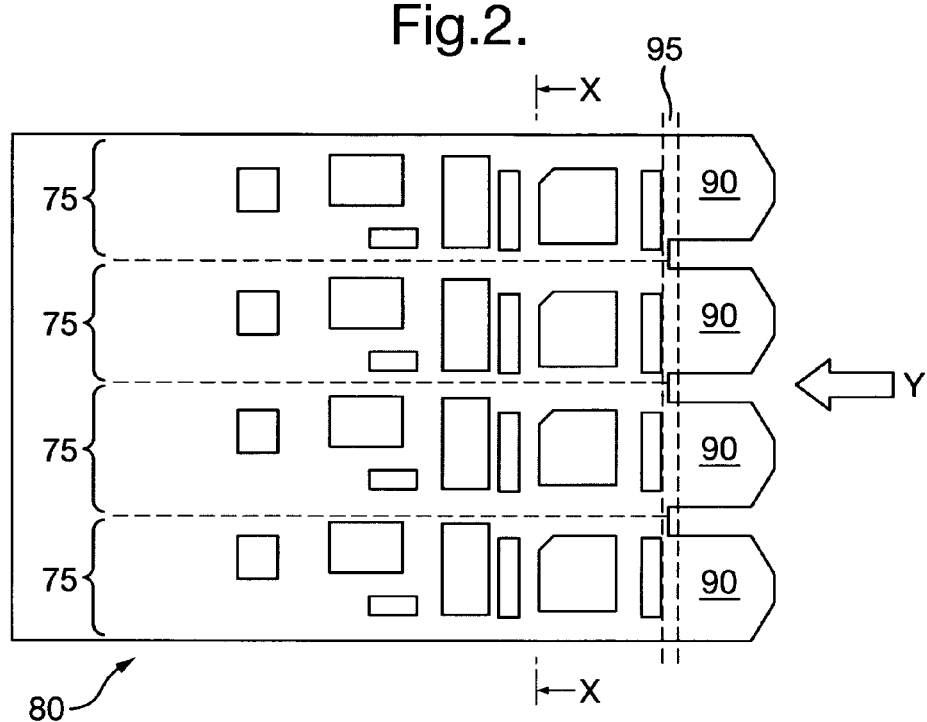

The present invention will now be described in greater detail, by way of example only, with reference to the accompanying drawings in which:

FIG. 1 represents a radar installation;
FIG. 2 represents a transmit/receive unit (TRU);
FIG. 3 represents a shield for the unit illustrated in FIG. 2;
FIG. 4 represents a cross section taken through X-X in FIG. 2;
FIG. 5 represents a view of a module taken on view Y depicted in FIG. 2; and
FIG. 6 represents a cross section taken through Z-Z of FIG. 4.

FIG. 1 illustrates a radar installation comprising a support structure 20 which may be mounted, for example, on the deck or mast head of a ship. An antenna structure 30 is mounted atop the support structure 20 via a bearing mechanism 45. The bearing mechanism 45 permits the antenna structure 30 to rotate freely about a vertical axis 50 with respect to the support structure 20. The antenna structure 30, comprises an antenna housing 35 together with one or more radomes 40. The, or each, radome 40 is made from a non-metallic material such as fibre glass and is, therefore, transparent to RF signals while the material of the housing 35 is substantially opaque to such signals.

The antenna structure 30 comprises an antenna assembly 60. In this embodiment, the antenna assembly 60 comprises two array faces 70, each aligned with a respective radome 40 and defining a chamber 65 between each array face 70 and a respective radome 40. Each array face 70 comprises a number of antenna elements 75 evenly distributed across the array face. FIG. 2 illustrates a transmit/receive unit (TRU) 80 comprising four antenna elements 75. Each antenna element 75 comprises a number of electronic components including a high power amplifier, a core processor, a filter and a duplexer component together with a dipole 90. The TRU is arranged such that the dipole 90 of each antenna element 75 protrudes through an array face plate 95 whilst the remainder of the TRU 80 is located behind the plate 90. Each antenna element 75 represents a different transmission/reception path.

Figure 3A:
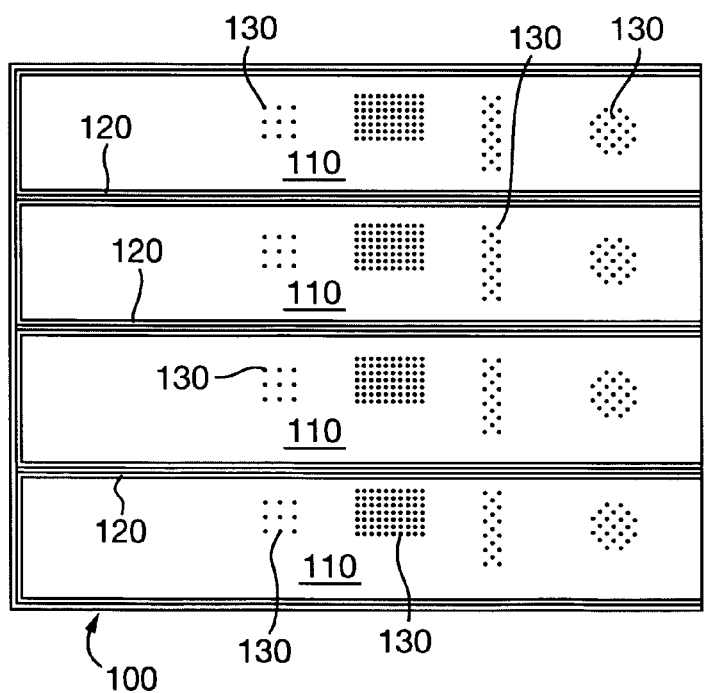

FIG. 3a illustrates a shield 100 for use in combination with the TRU 80 of FIG. 2. The shield 100, in this embodiment, is made from aluminium and is manufactured using super-plastic forming. The shield 100 may be made from an alternative, light weight, material that can readily be formed into complex geometries. Light weight materials are used to ensure that the weight associated with each TRU 80 can be kept to a minimum. The material must be electrically conductive and so metallic or metallised materials are considered appropriate.

Figure 3B:
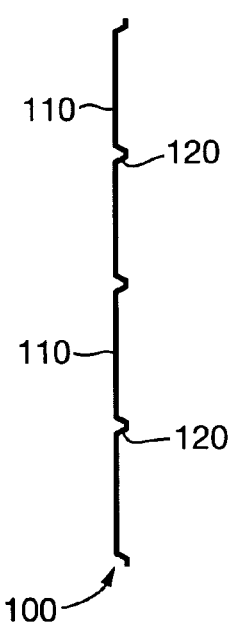

The profile of the shield 100 can be seen in FIG. 3b. The shield 100 is divided into four regions 110, each serving as a shielding surface, having troughs 120, each representing a sealing surface, formed therebetween. When the shield 100 is placed adjacent to "installed with respect to" the TRU 80 of FIG. 2, each trough 120 forms a seal with a corresponding surface of the TRU 80 to isolate the transmission/reception path of each antenna element 75 from the transmission/reception path of adjacent antenna elements. Formation of troughs 120 additionally serve to stiffen the shield 100 as they act as ribs. Consequently, the shield 100 inhibits bending of the TRU 80 in addition to providing a physical barrier or shield. Each (stiffening; shielding etc) serves to protect against mechanical damage to the electronic components of the TRU 80.

Upon assembly, a shield 100 is connected to each transmit/receive unit 80. If the TRU 80 comprises components on both sides a second, appropriately shaped shield 100' can be attached to the opposing side of the TRU 80.

Arrays of perforations 130 are formed through the thickness of shield 100 in the regions 110. Each array of perforations 130 is located such that it corresponds to one of the electronic components mounted on the transmit/receive unit 80. In use, a coolant fluid passes through the perforations 130 to effect cooling of the electronic components of the TRU 80. In providing an array of perforations 130 a high surface area can be cooled with a relatively small amount of impinging cooling fluid. Excellent heat transfer coefficients are achieved for a given cooling fluid flow rate, $\dot{m}$.

In addition to physical protection of the electronic components, shield 100 acts as a RF screen and an EMC screen. Consequently, the diameter of any perforations 130 should be kept to a minimum to prevent leakage and enhance the screening properties of the shield 100. Further the shield 100 comprises a conductive material (e.g. a metallic or metallised material) to enhance the RF and EMC screening functionality. The shield is configured to be sufficiently stiff such that a robust interface is provided to which an EMC gasket can be attached in use to inhibit RF and EMC leakage between the shield 100 and the TRU 80.

FIG. 4 illustrates a transmit/receive module 140 comprising a module housing 150. Each transmit/receive module 140 comprises four TRU 80. Each TRU 80 is offset from an adjacent TRU as illustrated to achieve a staggered configuration whereby the antenna elements 75 are not directly aligned with one another. FIG. 4 represents the image taken at a cross section X-X, depicted in FIG. 2. FIG. 5 represents a corresponding image when viewed from 'Y', also depicted in FIG. 2.

FIG. 5 illustrates the array face plate 95 having rectangular apertures 160 formed therein. Dipoles 90, from each respective antenna element 75, protrude through apertures 160 and into the chamber 65 formed between the array face plate 95 and the radome 40.

A number of modules 140 are provided adjacent one another and, together, form a sub-array. A number of sub-arrays make up the array face 70 of the antenna installation 10.

Returning to FIG. 1, the array assembly 60 comprises two array faces 70, diametrically opposed from one another and forming a plenum 170 therebetween. In this embodiment, a fan 180 is provided at an inlet to the plenum 170 to enable fluid to be forced into the plenum 170 and thereby elevate the pressure therewithin. Alternatively, high pressure gas could be delivered directly to the plenum 170.

In the previous embodiment, the electronic components each have a similar depth to one another and so regions 110 are substantially planar and spaced from a surface of the component by a distance, d. If, however the electronic components vary in depth, the profile of region 110 is configured accordingly to accommodate this variation and retain the spacing, d, between the shield 100 and each component or certain components. Such a profile is illustrated in the shield shown in FIG. 6.

In operation, and with reference to FIGS. 1 and 6, the fan 180 is caused to rotate, thereby driving cooling fluid, for example air, into the plenum 170 thus forcing the pressure in plenum 170 to rise. As the, or each, shield 100, 100' is sealably connected to the respective TRU 80, the only flow path available to the cooling fluid is through perforations 130. By virtue of the pressure difference across the shield 100, 100', fluid passing through perforations 130 is jetted in a direction substantially perpendicular to the shield 100, 100'. Each jet impinges the electronic components located on the TRU 80 adjacent to the perforations 130 to effect cooling thereof. The number, spacing and diameter of the perforations 130 can be varied so as to generate an appropriate level of cooling for the particular component to which it is directed. Furthermore, the distance, d, between each region 110 of shield 100, 100' and electronic components sited on the TRU 80 is selected to define the most efficient impact length for the jets impinging thereon.

As discussed above, impingement cooling results in very high heat transfer coefficients for a given cooling fluid flow rate, $\dot{m}$. The overall flow rate, $\dot{m}$, is regulated by designing the perforations 130 appropriately in relation to the pressure that can be achieved in the high pressure plenum 170. Preferably, jets of approximately 20-30 meters per second are achieved.

Cooling of the electronic components is thereby effected and the cooling fluid subsequently passes through rectangular apertures 160 and into the chamber 65 through the array face plate 95. Subsequently, the cooling fluid flows down through the structure 20 and returns to the fan 180 of the air conditioning unit as depicted in FIG. 1.

Whilst cooling is critical, fans 180 of the type used here consume a significant level of power. Fan power increases with the cube of the flow rate. By keeping air flow to a minimum through use of impingement cooling and, in particular by careful design of perforations 130, in terms of diameter, distribution (i.e. number of, spacing between and particular pattern of perforations) together with spacing, d, between shield 100, 100' and TRU 80, power use and consequent heat generation can be minimised.

The invention claimed is:

1. A printed circuit board shield assembly comprising a shield, a printed circuit board and an electronic component mounted on the printed circuit board, the shield comprising:
   a sealing surface connected to a sealing region of the printed circuit board; and
   a shielding surface, substantially parallel to and offset from the sealing surface,
   the shielding surface thereby defining a cover for receiving the electronic component and at least part of the printed circuit board, the shielding surface comprising an array of perforations formed therethrough for connection to a high pressure plenum for ingress of cooling fluid, the array of perforations being configured to correspond to the location of the electronic component mounted on the printed circuit board, the shield and printed circuit board being configured to define together an outlet for cooling fluid with respect to the plenum and provide a flow path for cooling fluid from the perforations to the outlet;
   wherein the offset between the shielding surface and the sealing surface is selected in dependence on a height of the electronic component such that the perforations provide impingement cooling of the electronic component.

2. A shield assembly according to claim 1, wherein the shielding surface comprises a first surface having a first offset dependent on the height of a first electrical component mounted on the printed circuit board and a second surface having a second offset, different than the first offset, dependent on the height of a second electronic component mounted on the printed circuit board, the heights of the first and second electrical components being different.

3. A shield assembly according to claim 1, wherein one of the group of number, spacing, distribution and magnitude of perforations in the array are configured in dependence on a heat generating capacity of the electronic component.

4. A shield assembly according to claim 1, wherein the shield is configured to serve as a radiofrequency interference screen.

5. A shield assembly according to claim 1, wherein the shield is configured to serve as an electromagnetic interference screen.

6. A shield assembly according to claim 1, wherein the shield comprises a metallic material.

7. A shield assembly according to claim 6, wherein the shield comprises aluminium.

8. A shield assembly according to claim 6, wherein the shield comprises a metallised material.

9. A shield assembly according to claim 8, wherein the shield comprises one of the group of a composite material, a ceramic material and a plastics material.

10. A shield assembly according to claim 1, wherein the shield is manufactured by super-plastic forming.

11. A shield assembly according to claim 1, wherein the shielding surface comprises a plurality of arrays of perforations formed therethrough, each array of the plurality of arrays of perforations being configured to correspond to a location of a different electronic component mounted on the printed circuit board, wherein at least one of a number, spacing, distribution and magnitude of perforations in each array are configured in dependence on a heat generating capacity of the respective corresponding electronic component.

12. A shield assembly according to claim 1, wherein the offset is selected such that the perforations define the most efficient impact length for jets impinging on the electronic component.

13. A shield assembly according to claim 1, wherein the impingement cooling jets have flow rates in use of approximately 20-30 meters per second.

14. A shield assembly according to claim 1, wherein the assembly comprises a plate at least partially defining the plenum and the outlet is mounted in an aperture in the plate.

15. A transmit/receive unit (TRU) for a radar installation comprising:
   a shield assembly according to claim 1, the electronic component comprising an antenna element having a dipole associated therewith; and
   a high pressure plenum for cooling fluid,
   the perforations of the shielding surface being connected to the plenum, such that the TRU comprises an inlet defined by the array of perforations configured to permit ingress of cooling fluid from the plenum and the shield and printed circuit board being configured to define together an outlet for egress of cooling fluid with respect to the plenum and provide a flow path for cooling fluid from the perforations to the outlet, the shielding surface and perforations being configured to provide impingement cooling of the antenna element.

16. A transmit/receive unit according to claim 15, wherein the printed circuit board comprises a plurality of antenna elements, each having a dipole associated therewith.

17. A transmit/receive unit according to claim 16, wherein the TRU comprises a plurality of inlets, each inlet being associated with a respective antenna element.

18. A transmit/receive unit according to claim 16, wherein the TRU comprises a plurality of outlets, each outlet being associated with a respective antenna element.

19. A radar installation comprising:
   an antenna housing;
   an array face plate, mounted within the antenna housing, the plate comprising a plurality of apertures therethrough; and
   a transmit/receive unit according to claim 12, mounted on and sealably connected to a surface of the array face plate, the, or each, dipole of the TRU protruding through a respective aperture, the, or each, inlet of the TRU being in fluid communication with the high pressure plenum so as to provide impingement cooling and the, or each, outlet of the TRU being co-located with a respective aperture.

* * * * *